US012733387B2

(12) United States Patent
Wang

(10) Patent No.: US 12,733,387 B2
(45) Date of Patent: Sep. 8, 2026

(54) DISPLAY PANEL AND METHOD OF MANUFACTURING SAME, AND DISPLAY DEVICE

(71) Applicant: Shenzhen China Star Optoelectronics Semiconductor Display Technology Co., Ltd., Shenzhen (CN)

(72) Inventor: Guojie Wang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 1063 days.

(21) Appl. No.: 17/886,994

(22) Filed: Aug. 12, 2022

(65) Prior Publication Data

US 2023/0189623 A1 Jun. 15, 2023

(30) Foreign Application Priority Data

Dec. 14, 2021 (CN) ......................... 202111531929.3
Jul. 14, 2022 (CN) ......................... 202210833365.7

(51) Int. Cl.
*H10K 71/00* (2023.01)
*H10K 59/12* (2023.01)
*H10K 59/122* (2023.01)

(52) U.S. Cl.
CPC ........... *H10K 71/00* (2023.02); *H10K 59/122* (2023.02); *H10K 59/1201* (2023.02)

(58) Field of Classification Search
None
See application file for complete search history.

(56) References Cited

U.S. PATENT DOCUMENTS 12,133,421 B2 10/2024 Chen et al.
12,178,084 B2 12/2024 Mei
(Continued)

FOREIGN PATENT DOCUMENTS

CN 110923627 3/2020
CN 113053967 6/2021
(Continued)

OTHER PUBLICATIONS

Notification of Office Action and Search Report Dated Feb. 22, 2025 From The State Intellectual Property Office of the People's Republic of China Re. Application No. 202210833365.7 and Its Translation Into English. (16 Pages).

*Primary Examiner* — Sue A Purvis
*Assistant Examiner* — Seyon Ali-Simah Punchbeddell

(57) ABSTRACT

A display panel, a display device, and a method of manufacturing the display panel are provided. The method of manufacturing the display panel includes the following steps: manufacturing a plurality of first electrodes arranged in an array on the array substrate, wherein a first interval is formed between adjacent first electrodes in a first direction, and wherein a second interval is formed between adjacent first electrodes in a second direction; covering a whole layer of the negative material on the first electrodes and the array substrate; exposing and developing the whole layer covered of the negative material, wherein the negative material in the first interval forms a first pixel definition layer, and wherein the negative material in the second interval forms a second pixel definition layer; exposing the first pixel definition layer again.

12 Claims, 7 Drawing Sheets

(56) References Cited

U.S. PATENT DOCUMENTS

| | | | | |
|---|---|---|---|---|
| 2013/0170008 | A1 * | 7/2013 | Shin | G02B 26/007<br>427/595 |
| 2022/0052131 | A1 * | 2/2022 | Li | H10K 59/173 |

FOREIGN PATENT DOCUMENTS

| | | |
|---|---|---|
| CN | 113555407 | 10/2021 |
| CN | 113571668 | 10/2021 |

* cited by examiner

DISPLAY PANEL AND METHOD OF MANUFACTURING SAME, AND DISPLAY DEVICE

FIELD OF INVENTION

The present application relates to a field of display technology, and in particular, to a display panel, a method of manufacturing the display panel, and a display device.

BACKGROUND OF INVENTION

Organic Light-emitting Diode (OLED) devices have the characteristics of self-light emitting, viewing angle light, high contrast ratio, fast response speed, thin and light, etc. OLED device have become a mainstream of display technology. Compared with using fine reticles and vacuum evaporation to manufacture OLED devices, inkjet printing technology has attracted much attention because of its precise alignment and no need for fine metal mask. Further, a material utilization rate of inkjet printing technology can reach 100%, therefore the inkjet printing technology become a mainstream of large-scale OLED device production in the future.

The organic light-emitting diode pixel arrangement is usually composed of a plurality of pixels, each pixel includes a red (R) sub-pixel, a green (G) sub-pixel, and a blue (B) sub-pixel. The R, G, B sub-pixels are arranged in sequence, and forming a matrix. This traditional pixel arrangement structure has the following problems: (1) During a printing process, due to an instability of a certain print head nozzle, a volume of the ink droplets in the pixels printed by the certain print head nozzle is too large or too small, resulting in the that there are bright lines or dark lines which causes uneven linear display when the product is displayed. (2) Only the nozzles corresponding to the sub-pixels spray ink, and the nozzles between the sub-pixels do not spray ink, resulting in low nozzle utilization, the number of printing cycles is large, the printing time is long, and the volatilization and drying conditions of the successively printed inks are different, thereby resulting in drying defects.

In order to solve the above technical problems, the technical solution adopted in the prior art is to connect all red sub-pixels, all green sub-pixels, and blue sub-pixels to form a linear pixel row. In this way, the ink printed into the pixels can be circulated with each other, and finally the volume is averaged, thereby solving the above technical problems.

However, in order to emit light independently, it is necessary to form the first pixel definition layer and the second pixel definition layer in the horizontal and vertical directions, respectively. Because the first pixel definition layer is made of hydrophilic material and the second pixel definition layer is made of hydrophobic material, it is necessary to make two glue-coating, exposure and development processes respectively, which are complicated in steps, high in material cost, and increased in the number of equipment, which makes the cost and time increased.

In view of this, it is necessary to develop a method of manufacturing a display panel, to solve a problem of increased cost of money and time for manufacturing the two-layer pixel definition layer.

SUMMARY OF INVENTION

Embodiments of the present application provide a display panel, a display device, and a method of manufacturing the display panel, which are used to solve the problems of increased cost and time for manufacturing a two-layer pixel definition layer.

In order to solve the above technical problems, the embodiments of the present application disclose the following technical solutions:

A method of manufacturing a display panel is provided, including the following steps: providing an array substrate;

manufacturing a plurality of first electrodes on the array substrate, wherein the plurality of first electrodes are arranged in an array on the array substrate, wherein a first interval is formed between adjacent first electrodes in a first direction, and wherein a second interval is formed between adjacent first electrodes in a second direction;

covering a whole layer of the negative material on the first electrodes and the array substrate;

exposing and developing the whole layer covered of the negative material, wherein the negative material in the first interval forms a first pixel definition layer with hydrophobicity, and wherein the negative material in the second interval forms second pixel definition layer with hydrophobicity;

exposing the first pixel definition layer again to make the first pixel definition layer with hydrophilic; and manufacturing a plurality of light-emitting layers on the first electrodes.

In addition to, or as an alternative to, one or more of the features disclosed above, a thickness of the second pixel definition layer is greater than a thickness of the first pixel definition layer.

In addition to, or as an alternative to, one or more of the features disclosed above, the thickness of the first pixel definition layer ranges from 0.2 um to 0.5 um, and wherein the thickness of the second pixel definition layer ranges from 1 um to 2 um.

In addition to, or as an alternative to, one or more of the features disclosed above, a thickness of the first pixel definition layer is greater than a thickness of the first electrode.

In addition to, or as an alternative to, one or more of the features disclosed above, a thickness of the light-emitting layer is less than a thickness of the second pixel definition layer.

In addition to, or as an alternative to, one or more of the features disclosed above, in the step of exposing the first pixel definition layer again, UV light is used to expose the first pixel definition layer again.

In addition to, or as an alternative to, one or more of the features disclosed above, the step of exposing the first pixel definition layer again to make the first pixel definition layer with hydrophobicity includes the following steps:

providing a reticle;

placing the reticle on the negative material such that an opening on the reticle correspond to the first pixel definition layer;

exposing the first pixel definition layer again to make a material of the first pixel definition layer is changed from hydrophobicity to hydrophilicity; and removing the reticle.

In addition to, or as an alternative to, one or more of the features disclosed above, the step of providing the reticle includes the following steps:

providing a transparent substrate;

forming a metal layer on the transparent substrate, and etching the metal layer to form an opening on the metal layer;

forming a plurality of support columns on a side of the transparent substrate away from the metal layer to form a mask.

In addition to, or as an alternative to, one or more of the features disclosed above, a thickness of the support column is greater than or equal to 0.2 micrometers and less than or equal to 0.8 micrometers.

In addition to, or as an alternative to, one or more of the features disclosed above, a thickness of the first pixel definition layer is less than a thickness of the light-emitting layer.

In addition to one or more of the features disclosed above, or as an alternative, in the step of exposing and developing the whole layer covered of the negative material, a halftone reticle is configured to expose and develop the whole layer covered of the negative material.

In addition to one or more of the features disclosed above, or as an alternative, a printing groove is formed between adjacent second pixel definition layers, and wherein a light-emitting material can be continuously printed along an extending direction of the printing groove to form a light-emitting layer.

In addition to one or more of the features disclosed above, or alternatively, after the step of manufacturing the plurality of light-emitting layers further includes: manufacturing a second electrode on the light-emitting layer and the second pixel definition layer.

Embodiments of the present application also provide a display panel, including:

an array substrate;

a plurality of first electrodes arranged in an array on the array substrate, wherein a first interval is formed between adjacent first electrodes in a first direction, and wherein a second interval is formed between adjacent first electrodes in a second direction;

a pixel definition structure disposed on the array substrate and the plurality of first electrodes, wherein the pixel definition structure includes a first pixel definition layer and a second pixel definition layer arranged in a same layer, wherein the first pixel definition layer is positioned in the first interval, wherein the second pixel definition layer is positioned in the second interval, wherein the first pixel definition layer has hydrophilicity, and wherein the second pixel definition layer has hydrophobicity;

a plurality of light-emitting layers disposed on the plurality of first electrodes.

In addition to, or as an alternative to, one or more of the features disclosed above, the plurality of light-emitting layers covers the first electrodes and the first pixel definition layer.

In addition to, or as an alternative to, one or more of the features disclosed above, the first pixel definition layer is partially overlapped on a side of the first electrode away from the array substrate.

One embodiment of the present application further provides a display device, wherein the display device includes the display panel described in any one of the above.

One of the above technical solutions has the following advantages or beneficial effects: only one layer of negative material needs to be coated, and two layers of pixel definition layers can be obtained by exposing, developing and then exposing, which saves the cost of materials, equipment and time, and improves an efficiency of manufacturing. After the process of manufacturing a pixel definition layer is reduced, a yield problem caused by this process is also reduced, and a product yield is improved.

DESCRIPTION OF FIGURES

The technical solutions and other beneficial effects of the present application will be apparent through the detailed description of the specific embodiments of the present application with reference to the accompanying figures.

DETAILED DESCRIPTION OF EMBODIMENTS

The technical solutions in the embodiments of the present application will be clearly and completely described below with reference to the accompanying figures in the embodiments of the present application. In the description of the present application, it should be understood that the terms "center", "longitudinal", "lateral", "length", "width", "thickness", "upper", "lower", "front", "rear", "left", "right", "vertical", "horizontal", "top", "bottom", "inside", "outside", "clockwise", "counterclockwise", etc. are based on the orientation or positional shown in the accompanying figures, which is only for the convenience of describing the present application and simplifying the description, rather than indicating or implying that the referred device or element must have a specific orientation, be constructed and operated in a specific orientation. Therefore, it should not be construed as a limitation of the present application.

Figure 1:
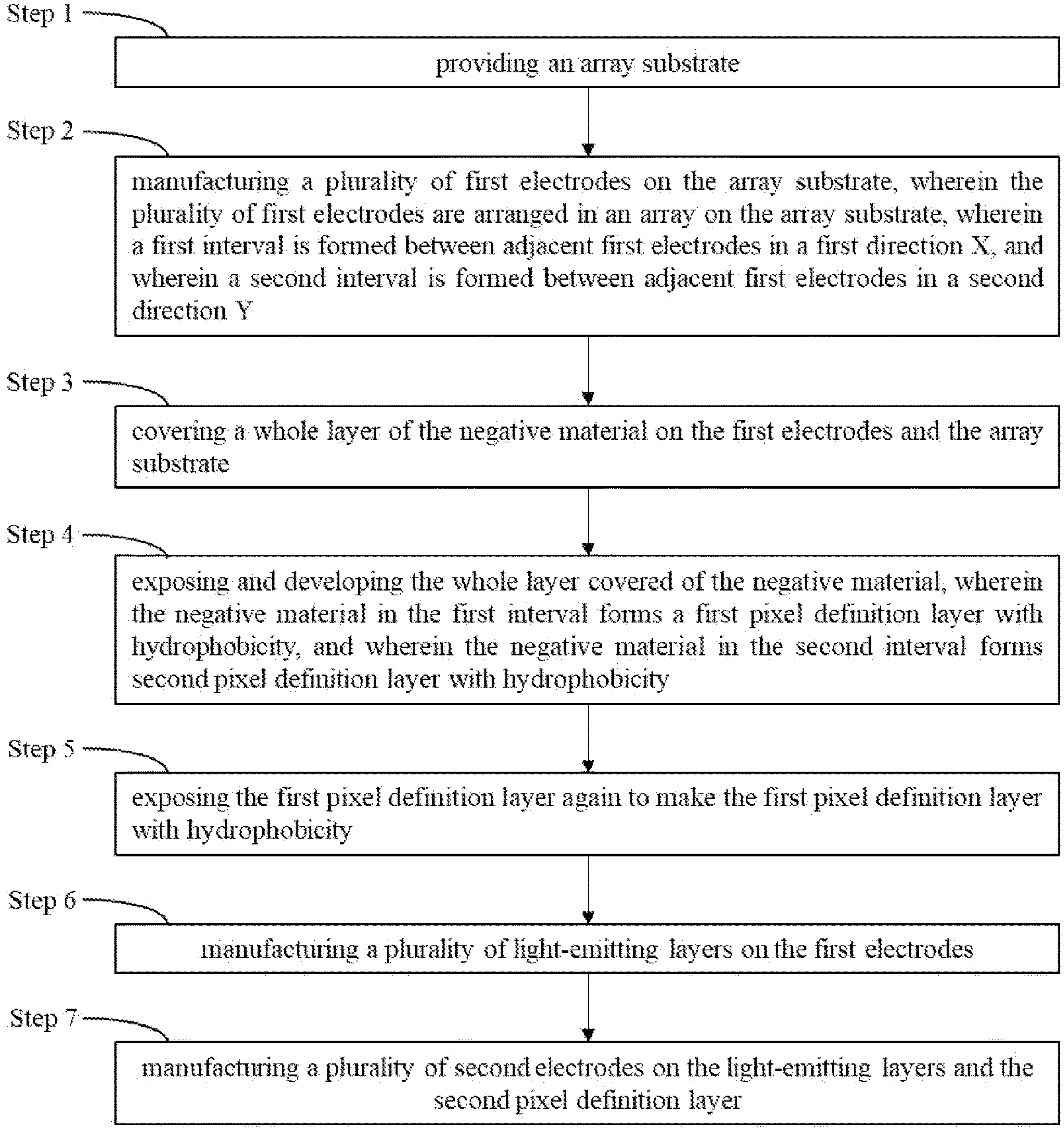
FIG. 1 is a schematic flowchart of a method of manufacturing a display panel provided by one embodiment of the present application.

Please refer to FIG. 1. FIG. 1 is a schematic flowchart of a method pf manufacturing a display panel according to one embodiment of the present application. The method of manufacturing the display panel includes steps 1 to 7.

Step 1: providing an array substrate.

Figure 2:
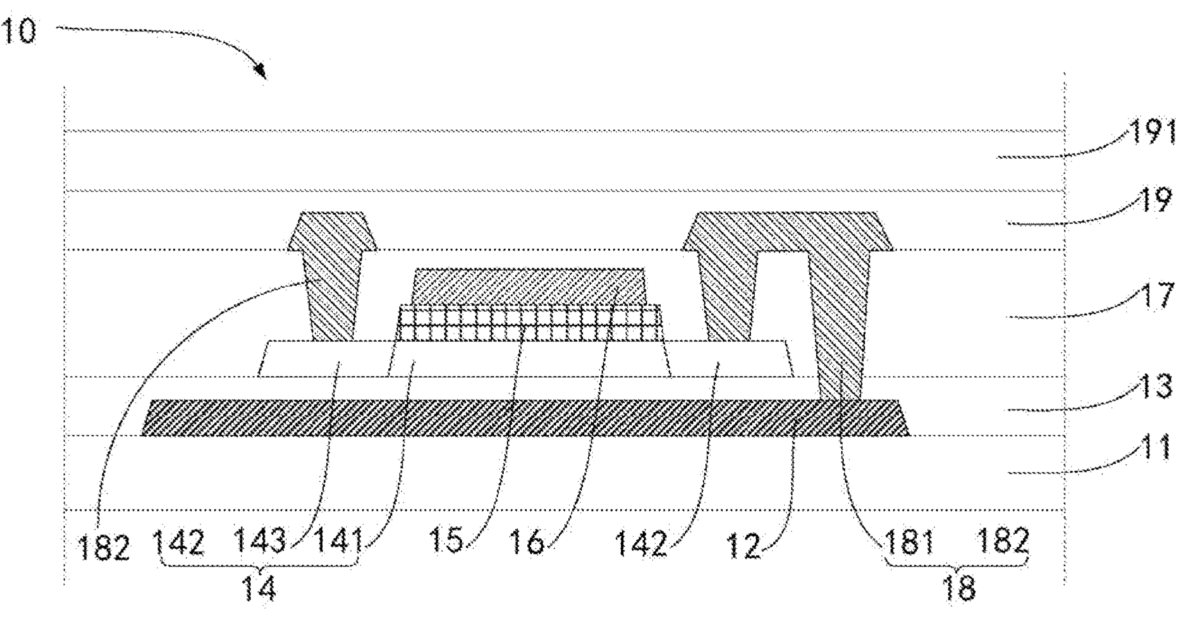
FIG. 2 is a schematic cross-sectional structural diagram of an array substrate provided by one embodiment of the present application.

Please refer to FIG. 2, which is a schematic cross-sectional structural diagram of the array substrate according to one embodiment of the present application.

Specifically, a base substrate 11 is provided. The base substrate 11 may be a rigid substrate or a flexible substrate. The base substrate 11 may include a rigid substrate such as a glass substrate When the base substrate 11 is a rigid substrate. The base substrate 11 may include flexible substrates such as polyimide films, ultra-thin glass films, etc. when the base substrate 11 is a flexible substrate.

Optionally, a metal layer is deposited on the base substrate 11. The metal layer may be a stack of single-layer or multi-layer metal layers. The metal layer is patterned to form a light-shielding layer 12 with wiring and light-shielding functions.

Optionally, a deposition process such as a plasma enhanced chemical vapor deposition (PECVD) is used to deposit a buffer layer 13 on the light-shielding layer 12 and the base substrate 11. A material can be inorganic materials such as silicon oxide, silicon nitride, and silicon oxynitride, for example, one or a combination of several of $Si_3N_4$, $SiO_2$, $SiO_N$, and the like. A thickness of the buffer layer 13 may be range from 1000 angstroms to 5000 angstroms.

Optionally, a deposition process such as physical vapor deposition (PVD) is used to deposit a metal oxide semiconductor material on the buffer layer 13, and the metal oxide semiconductor material may be IGZO, ITZO, IGZTO, or the like. The metal oxide semiconductor is patterned to form an active layer 14. A thickness of the active layer 14 may be range from 100 angstroms to 1000 angstroms.

Optionally, a deposition process such as PECVD is used to deposit a gate dielectric material on the active layer 14 and the buffer layer 13. The gate dielectric material includes SiOx or the like. A thickness of the deposited gate dielectric material may be range from 500 angstroms to 2000 angstroms.

Optionally, a gate metal layer is deposited on the gate dielectric material by a deposition process such as PVD. The gate metal layer is patterned to form a gate pattern. By using the gate pattern as a shield to etch the gate dielectric material, and forming the gate electrode 16, the gate insulating layer 15, and the channel region 141 of the active layer 14 by self-alignment, so that the active layer 14 is divided into a channel region 141, a source electrode region 142, and a drain electrode region 143.

Optionally, an inorganic thin film such as $SiO_2$ is deposited on the gate electrode 16, the active layer 14, and the buffer layer 13 by a deposition process such as PECVD to form an interlayer insulating layer 17. A thickness of the interlayer insulating layer 17 ranges from 2000 angstroms to 8000 angstroms. The interlayer insulating layer 17 and the buffer layer 13 are patterned to form a plurality of through holes.

Optionally, a source-drain metal layer is deposited on the interlayer insulating layer 17 by a deposition process such as PVD. The source-drain metal layer is patterned to form a source/drain layer 18. The source/drain layer 18 includes a source electrode 181 and a drain electrode 182 and so on. The drain electrode 182 is connected to the drain region 143 of the active layer 14 through the through hole of the interlayer insulating layer 17. The source electrode 181 is connected to the source region 142 of the active layer 14 through the through hole of the interlayer insulating layer 17, and also through the through hole passing through the interlayer insulating layer 17 and the buffer layer 13 connected to the light-shielding layer 12.

Optionally, an inorganic thin film such as $SiO_2$ is deposited on the source/drain layer 18 and the interlayer insulating layer 17 by a deposition process such as PECVD as the passivation layer 19. The thickness of the passivation layer 19 may be ranges from 1000 angstroms to 5000 angstroms. Then, a planarization layer 191 is deposited on the passivation layer 19, and a material of the planarization layer 191 includes organic photoresist and the like. The planarization layer 191 and the passivation layer 19 are patterned to form through holes, and thus the manufacturing of the array substrate 10 is completed.

Step 2: manufacturing a plurality of first electrodes on the array substrate, wherein the plurality of first electrodes are arranged in an array on the array substrate, wherein a first interval is formed between adjacent first electrodes in a first direction X, and wherein a second interval is formed between adjacent first electrodes in a second direction Y.

Figure 3:
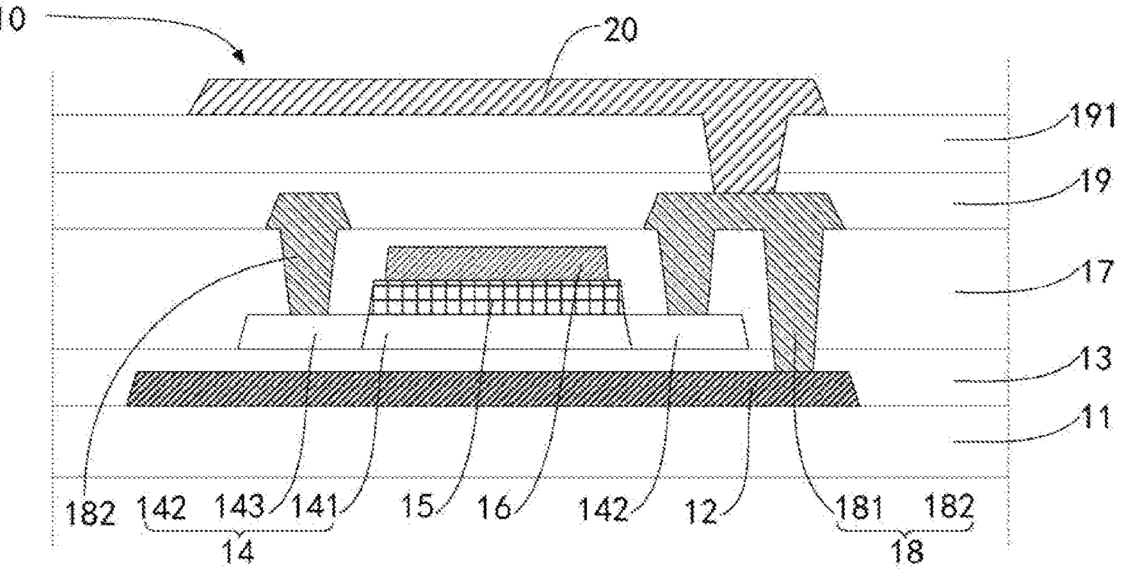
FIG. 3 is a schematic cross-sectional structural diagram of the display panel manufactured in step 2 of the manufacturing method provided by one embodiment of the present application.
Figure 4:
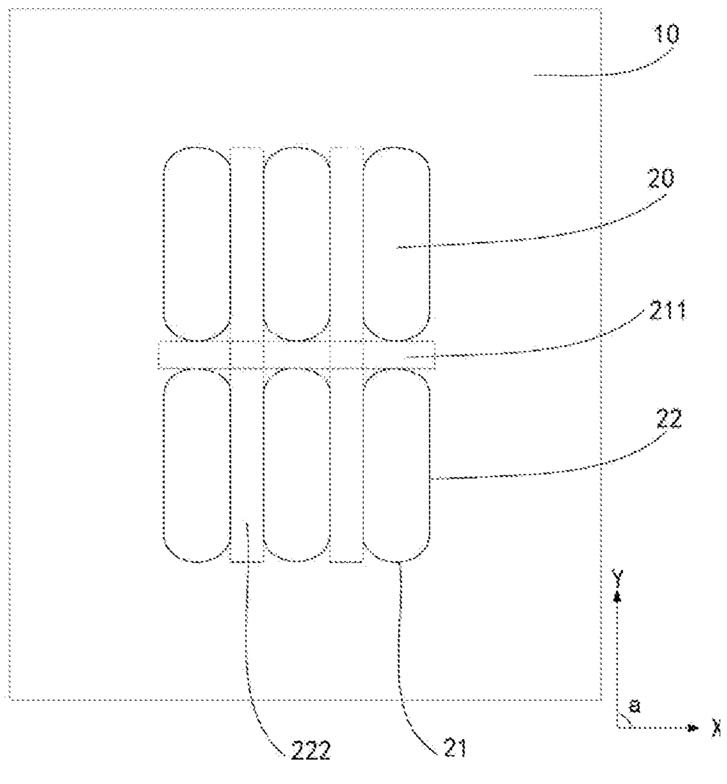
FIG. 4 is a schematic top-view structural diagram of the display panel manufactured in step 2 of the manufacturing method provided by one embodiment of the present application.

Please refer to FIG. 3 and FIG. 4. FIG. 3 is a schematic cross-sectional structural diagram of the display panel manufactured in step 2 of the manufacturing method provided by one embodiment of the present application. FIG. 4 is a schematic top-view structural diagram of the display panel manufactured in step 2 of the manufacturing method provided by one embodiment of the present application. Specifically, an electrode material is deposited on the array substrate 10. The electrode material is patterned to form a plurality of first electrodes 20 arranged in an array. The electrode material includes a transparent conductive electrode material, such as (indium oxide (ITO) etc. Of course, the present application is not limited to this, and the first electrode 20 of the present application may also be an opaque electrode, which may be determined according to a light-emitting direction of the display panel. The first electrode is the anode.

Optionally, a plurality of first electrodes 20 are arranged in an array on the array substrate 10. A first interval 211 is formed between adjacent first electrodes 20 in the first direction X. A second interval 222 is formed between adjacent first electrodes 20 in the second direction Y. Exemplarily, the first electrode 20 includes a short side 21 and a long side 22. The short side 21 is arranged along the first direction X, and the long side 22 is arranged along the second direction Y. The first interval 211 is formed between the short sides 21 of the adjacent first electrodes 20, and the second interval 222 is formed between the long sides 22 of the adjacent first electrodes 20.

Step 3: Covering a whole layer of the negative material on the first electrodes and the array substrate.

Step 4: exposing and developing the whole layer covered of the negative material by a halftone reticle, wherein the negative material in the first interval forms a first pixel definition layer with hydrophobicity, and wherein the negative material in the second interval forms second pixel definition layer with hydrophobicity.

Figure 5:
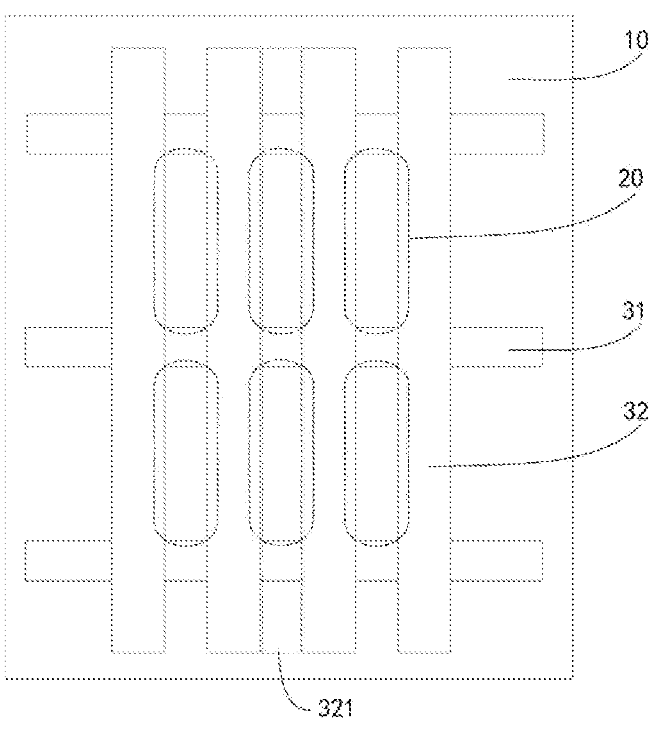
FIG. 5 is a schematic top-view structural diagram of the display panel manufactured in step 4 of the manufacturing method provided by one embodiment of the present application.

Referring to FIG. 5, a thickness of the first pixel definition layer 31 is greater than a thickness of the first electrode 20, and a thickness of the second pixel definition layer 32 is greater than a thickness of the first pixel definition layer 31. A printing groove 321 is formed between adjacent second pixel definition layers 32. For an overlapping portion of the first pixel definition layer 31 and the second pixel definition layer 32, the first pixel definition layer 31 is covered by the second pixel definition layer 32. A thickness of the first pixel definition layer 31 ranges from 0.2 um to 0.5 um, and a thickness of the second pixel definition layer 32 ranges from 1 um to 2 um.

Step 5: exposing the first pixel definition layer again to make the first pixel definition layer with hydrophobicity.

After forming the first pixel definition layer 31 and the second pixel definition layer 32, since the second pixel definition layer 32 is mainly used to define the positions of the light-emitting pixels, the first pixel definition layer 31 is mainly used to connect two adjacent first electrodes 20 separation, that is, the main functions of the first pixel definition layer 31 and the second pixel definition layer 32 are different, so that the requirements for their hydrophilicity and hydrophobicity are also different. By adjusting the hydrophilicity and hydrophobicity of the first pixel definition layer 31, the contact angles of the surfaces of the first pixel definition layer 31 and the second pixel definition layer 32 are different, which helps to improve a structural stability of the subsequent manufacturing film layers, thereby improving an overall performance.

Figure 12:
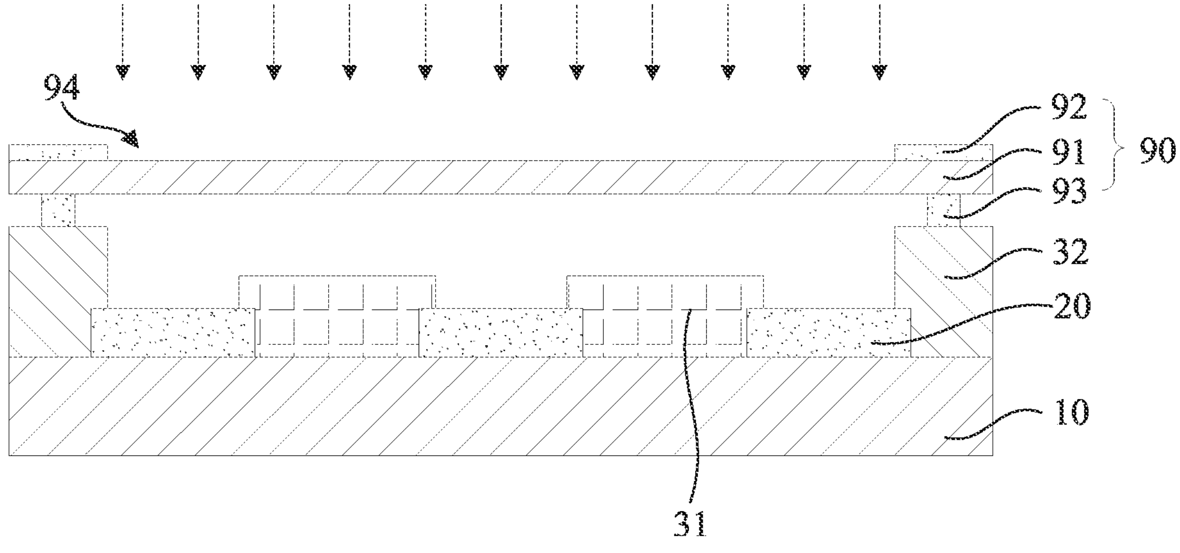
FIG. 12 is a schematic diagram of the reticle used in the display panel manufacturing process provided by one embodiment of the present application.

Optionally, step 5 in this embodiment of the present application mainly includes the following content:

Please refer to FIG. 12, first, a reticle 90 is provided. The reticle 90 is placed on a negative material so that the opening 94 on the reticle 90 correspond to the first pixel definition layers 31. Then the first pixel definition layers 31 are exposed again to make the material of the first pixel definition layers 31 change from hydrophobicity to hydrophilicity, and then removing the reticle 90.

Specifically, the reticle 90 using opening 94 corresponding to the first pixel definition layer 31 exposes the first pixel definition layer 31 again by UV light. The UV light will destroy the hydrophobicity of the first pixel definition layer 31, so that the first pixel definition layer 31 has hydrophilicity. The UV light breaks the fluorine bonds of the fluorine ions on the surface of the first pixel definition layer 31, and after the fluorine bonds are broken, the fluorine ions are freed and volatilized, thereby the hydrophobicity becoming hydrophilic.

It should be noted that a transition method of the hydrophilicity and hydrophobicity of the material of the first pixel definition layer 31 is related to the initial properties of the first pixel definition layer 31 and a hydrophilicity and a hydrophobicity of the light-emitting layer 50. When the light-emitting layer 50 is hydrophilic and the first pixel definition layer 31 is hydrophobic, the first pixel definition layer 31 needs to be converted from hydrophobicity to hydrophilicity; when the light-emitting layer 50 is hydrophobic, the first pixel definition layer 31 is hydrophilic, the first pixel definition layer 31 needs to be converted from hydrophilicity to hydrophobicity, so that the hydrophilicity and hydrophobicity of the first pixel definition layer 31 is consistent with the hydrophilicity and hydrophobicity of the light-emitting layer 50.

In other embodiments, the reticle 90 with the openings 94 corresponding to the first pixel definition layer 31 and the first electrode 20 can also be used to expose the first pixel definition layer 31 again, because the first electrode 20 is an anode, and the anode is a metal, the UV light will not affect the anode.

In this step, only one exposure is required, and no developing step is required to make the first pixel definition layer hydrophilic, which reduces the process steps and saves the cost.

In the prior art, two times of coating, two times of exposure and two times of development are required to manufacture the first pixel definition layer with hydrophilicity and the second pixel definition layer with hydrophobicity. However, in the embodiment of the present application, only one coating and two exposures are needed to manufacture the first pixel definition layer with hydrophilicity and the second pixel definition layer with hydrophobicity. Compared with the currently technology, the cost of materials, equipment and time are saved, and the manufacturing efficiency is improved.

Figure 9:
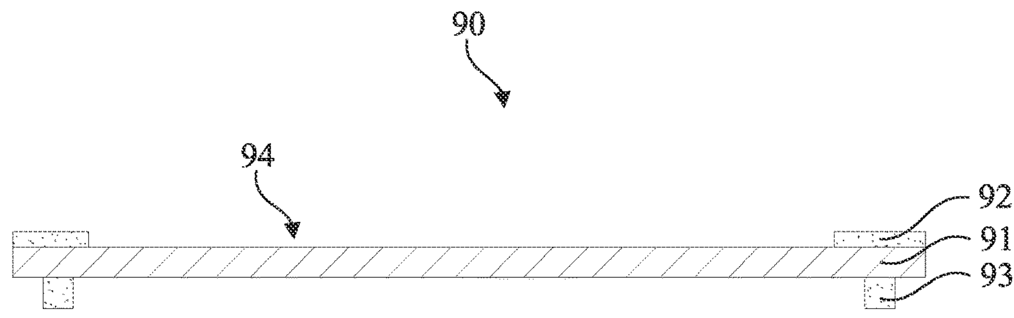
FIG. 9 is a schematic cross-sectional structural diagram of a reticle provided by one embodiment of the present application.

Optionally, the reticle 90 needs to be manufactured first when providing the reticle 90, which specifically includes the following steps:

Referring to FIG. 9, a transparent substrate 91 is provided first, then a metal layer 92 is formed on the transparent substrate 91, and etching the metal layer 92 to form openings 94 on the metal layer. Then forming a plurality of support columns 93 on a side of the transparent substrate 91 away from the metal layer 92 to form the reticle 90.

Specifically, the transparent substrate 91 is served as a support structure for the reticle 90 to ensure a structural stability of the reticle 90. Using a transparent material to form the substrate facilitates that when the first pixel definition layers 31 are processed, light can pass through the transparent substrate 91 and irradiate onto the first pixel definition layers 31.

Figure 10:
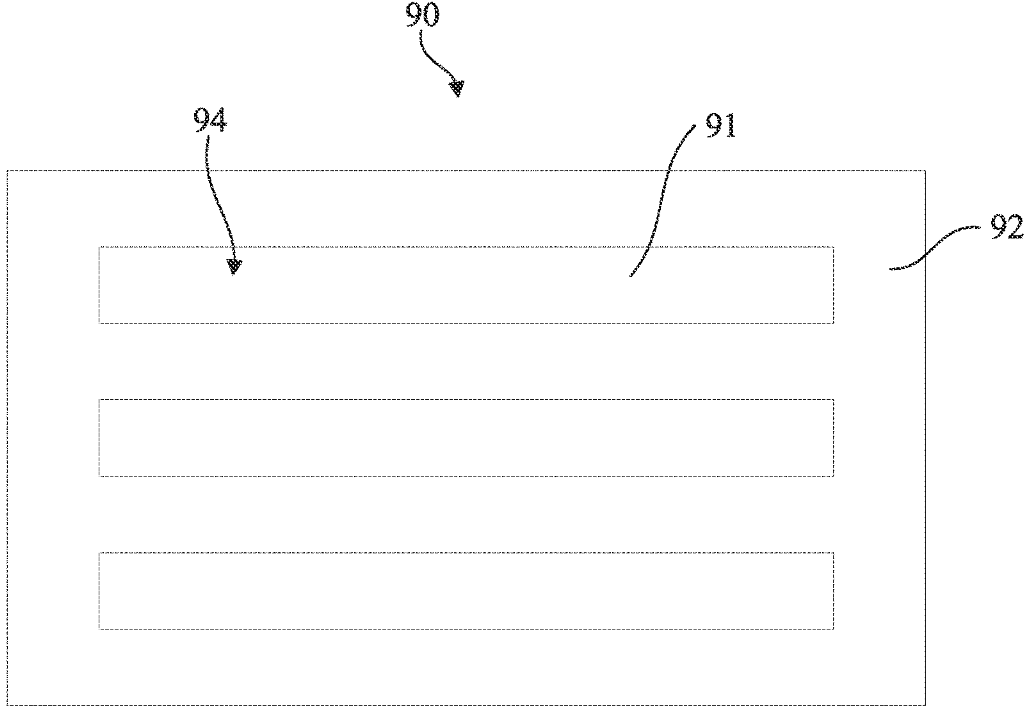
FIG. 10 is a front view of a reticle provided by one embodiment of the present application.

Only part of the structure needs to be processed, therefore another part of the negative material needs to be shielded when the negative material is processed. Referring to FIG. 10, in the embodiment of the present application, a metal layer 92 is manufactured on the transparent substrate 91. Since the metal layer 92 is not light-transmitting and can be used for shielding. The metal layer 92 is etched according to the requirement of light transmission, so that the metal layer 92 in a corresponding region is removed to form openings 94 on the metal layer 92.

Figure 11:
FIG. 11 is a back view of the reticle provided by one embodiment of the present application.
Figure 11:
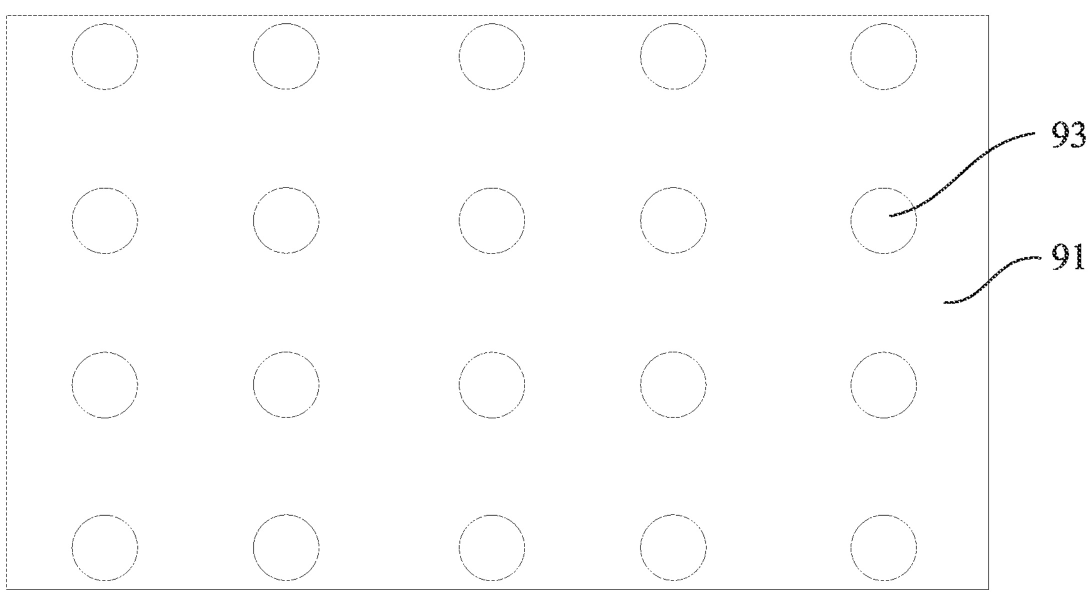

Referring to FIGS. 10 and 11, after the manufacturing of the metal layer 92 is completed, a plurality of support columns 93 are formed on a side of the transparent substrate 91 away from the metal layer 92, thereby completing the manufacturing of the reticle 90. Positions of the support columns 93 on the transparent substrate 91 away from the metal layer 92 needs to avoid the opening 94 to avoid an influence of the support column 93 on the light transmission effect of the reticle 90. At the same time, the arrangement of the support columns 93 helps to improve a stability of the reticle 90 during use, and ensures a processing effect of the negative material.

A plurality of support columns 93 are arranged between two adjacent openings 94 when the reticle 90 includes a plurality of openings 94 and the plurality of support columns 93 to avoid a light transmission effect of the reticle 90 caused by the arrangement of the support columns 93. At the same time, a stability of the reticle 90 during use is further enhanced.

After the reticle 90 is manufactured, the reticle 90 is placed on the negative material, to make the support columns 93 are in contact with the second pixel definition layers 32. That is, the openings 94 correspond to the first pixel definition layers 31, to facilitate the processing of the first pixel definition layer 31. Similarly, the support columns 93 are made to abut against the first pixel definition layers 31 when the second pixel definition layer 32 needs to be processed. That is, the openings 94 corresponds to the second pixel definition layers 32. By abutting the support columns 93 with the second pixel definition layer 32, when the reticle 90 is placed on the negative material, the reticle 90 may be rubbed to damage the negative material, thereby affecting the manufacturing of subsequent layers.

It should be noted that when the first pixel definition layer 31 is exposed again, the array substrate 10, the first electrodes 20, the first pixel definition layer 31, and the second pixel definition layer 32 can be transferred to a cleaning equipment as a whole. The first pixel definition layer 31 is changed from hydrophobicity to hydrophilicity when the light-emitting device in the cleaning equipment is cleaned. Compared with the direct use of traditional exposure and development equipment, this processing method can effectively reduce the production cost, and can also reduce a cost of the first pixel definition layer 31 from hydrophobicity to hydrophilicity. An influence of light during exposure on the structure of the first pixel definition layer 31 is reduced.

Optionally, in the embodiment of the present application, the thickness of the support column 93 is greater than or equal to 0.2 micrometers and less than or equal to 0.8 micrometers. If the thickness of the support column 93 is too thick, a distance between the transparent substrate 91 and the negative material will be too long. During the processing of the first pixel definition layer 31, due to an influence of illumination angle, it may cause light to irradiate the region blocked by the reticle 90 through the distance between the transparent substrate 91 and the negative material, thereby affecting the processing effect of the negative material. If the thickness of the support column 93 is too small, the support column 93 will not be able to effectively support effect, thereby causing the reticle 90 to rub against the negative material.

In an actual manufacturing process, a thickness of the support column 93 can be set to 0.2 μm, 0.4 μm, 0.6 μm, or 0.8 μm, etc., which can effectively prevent the reticle 90 from rubbing and damaging the negative material, and can also prevent light from irradiating the area blocked by the reticle 90 through the distance between the transparent substrate 91 and the negative material, to guarantee effective processing of the negative material. A specific value of the thickness of the support column can be adjusted according to the actual requirements, an no special limitation in here.

It should be noted that, in the embodiment of the present application, a cross section of the support column 93 can be a circle, an ellipse, a triangle, or other regular or irregular shapes, and it is only necessary to ensure that the support column 93 can stably place the reticle 90 on the negative material. The specific structure and shape can be adjusted according to the actual design requirements, and no special restrictions are made here.

Step 6: manufacturing a light-emitting layer on the first electrode.

Specifically, the light-emitting material of a same color is continuously printed in a same printing groove 321, and the light-emitting material of different colors are printed in different printing grooves 321, to form the light-emitting layers 50. The light-emitting layers 50 are formed on the first on the first electrodes 20.

The light-emitting materials of different colors are dissolved in the solvent to form different inks, and then the inks are printed in the printing grooves 321 formed by the adjacent second pixel definition layers 32 using processes such as inkjet printing. The inks formed by different colors of light-emitting materials are printed in different printing grooves 321, and the inks are cured to form films to form the light-emitting layers 50.

Figure 6:
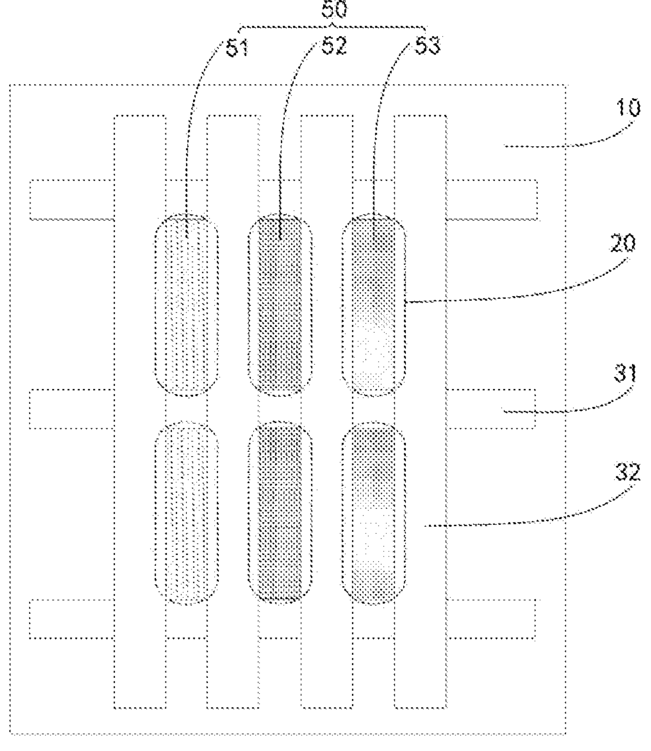
FIG. 6 is a schematic top-view structural diagram of the display panel manufactured in step 6 of the manufacturing method provided by one embodiment of the present application.
Figure 7:
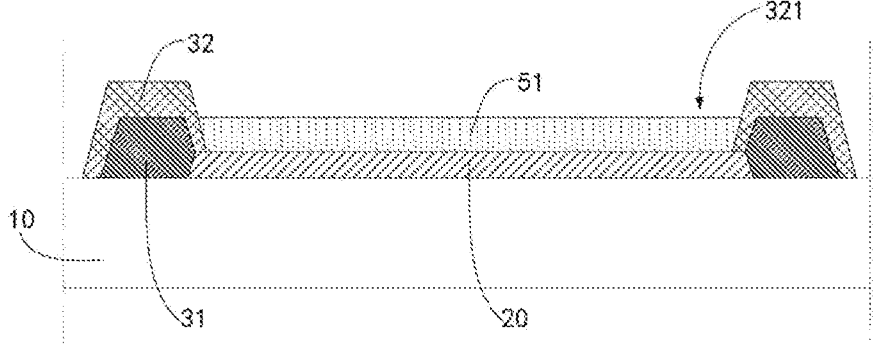
FIG. 7 is a schematic cross-sectional structural diagram of the display panel manufactured in step 6 of the manufacturing method provided by one embodiment of the present application.

Please refer to FIG. 6 and FIG. 7, a red light-emitting material 51, a green light-emitting material 52, and a blue light-emitting material 53 are arranged in different printing grooves 321 at intervals. Since the printing grooves 321 are continuous, ink can be continuously printed in the printing grooves 321. A concentration of the ink can be configured according to a thickness of the light-emitting layer 50 to be manufactured.

FIG. 6 schematically shows three printing grooves 321, but the display panel may include more first electrodes 20, so that more strips of the second pixel definition layers 32 are provided to form more printing grooves 321. The red light-emitting material 51, the green light-emitting material 52, and the blue light-emitting material 53 are sequentially arranged in more printing grooves 321 in a cycle. The thickness of the second pixel definition layer 32 is greater than the thickness of the light-emitting layer 50.

At the same time, the light-emitting materials of a same color between the adjacent second pixel definition layers 32 are separated by the first pixel definition layer 31, so that the light-emitting materials only cover the first electrodes 20 in the light-emitting region, but not covered on the first pixel definition layer 31. However, different color light-emitting materials are printed in different printing grooves 321, so the adjacent first pixel definition layers 31 exhibit different color light-emitting materials arranged at intervals. That is, the first pixel definition layer 31 is configured to define light-emitting materials of a same color, and the second pixel definition layers 32 are configured to define light-emitting materials of different colors.

A volume of the ink is much larger than a volume of the light-emitting layer 50 after curing and film formation when printing ink in the printing groove 321, wherein the ink has fluidity. At this time, the first pixel definition layer 31 with hydrophilic properties can speed up the flow of the ink in the printing groove 321, so that the printed ink can be quickly dispersed in the area defined by the first pixel definition layer 31, and preventing an accumulation and overflow of ink in a certain region, which can further improve an efficiency of continuous printing. The second pixel definition layer 32 having hydrophobic properties at the same time can prevent the printed ink from overflowing into the adjacent printing grooves 321 to cause color mixing. Of course, the thickness of the second pixel definition layer 32 needs to match a height of the printed ink.

In other embodiments, the first pixel definition layer 31 between the adjacent second pixel definition layers 32 may also be covered with the light-emitting material, at this time, the thickness of the first pixel definition layer 31 may be smaller than the thickness of the light-emitting layer 50. Continuous printing can still be used when printing the light-emitting material to form the light-emitting layer 50 to improve the printing efficiency, and the formed light-emitting layer 50 is also continuous.

Step 7: manufacturing a plurality of second electrodes on the light-emitting layers and the second pixel definition layer.

Figure 8:
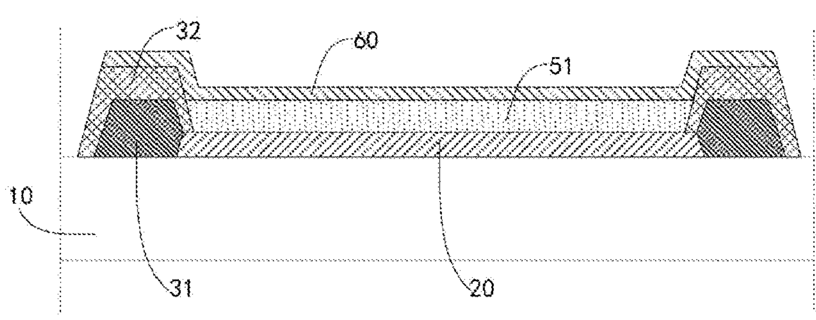
FIG. 8 is a schematic cross-sectional structural diagram of the display panel manufactured in step 7 of the manufacturing method provided by one embodiment of the present application.

In order to realize that the light-emitting layer 50 emits light, a second electrode 60 needs to be provided. The second electrode 60 covers the light-emitting layer 50 and the second pixel definition layer 32, as shown in FIG. 8. The first electrode 20 is an anode, and the second electrode 60 is a cathode, but the present application is not limited thereto. The light-emitting layer 50 emits light under a combined action of the first electrode 20 and the second electrode 60, and the array substrate 10 provides a driving voltage to the first electrodes 20.

In the method of manufacturing the display panel provided in this embodiment, only one layer of negative material needs to be applied, and then two layers of pixel definition layers can be obtained by performing exposure, development, and then exposure, which saves the cost of materials, equipment and time, and improves an efficiency of the manufacturing process. After the process of manufacturing the pixel definition layer is reduced, a yield problem caused by this process is also reduced, and the product yield is improved.

Figure 13:
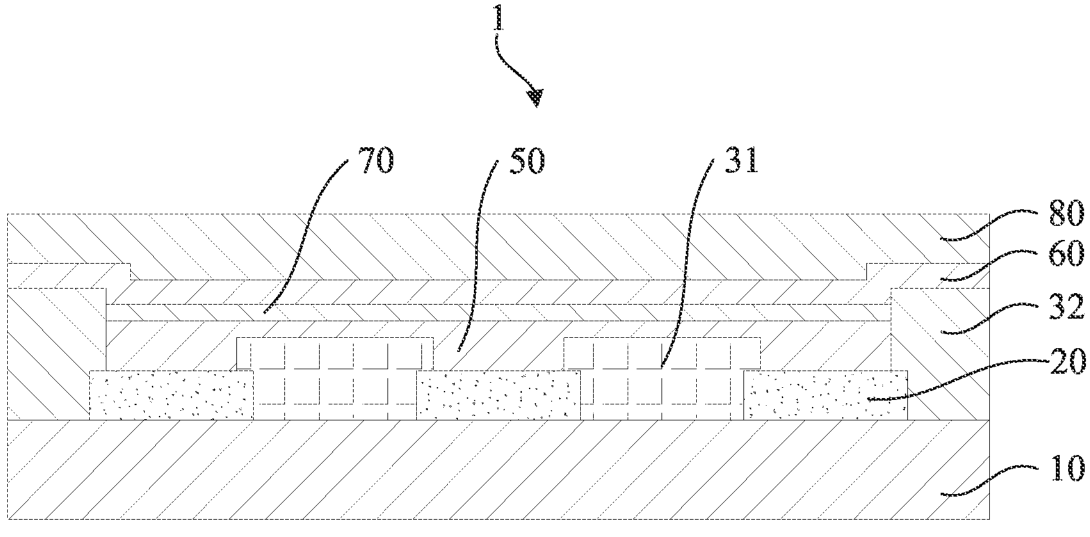
FIG. 13 is a schematic structural diagram of the display panel provided by one embodiment of the present application.

One embodiment of the present application also provides a display panel, please refer to FIG. 13, the display panel 1 includes an array substrate 10, and a thin film transistor layer is disposed in the array substrate 10, and the thin film transistor layer includes a plurality of thin film transistors to form a plurality of switches. Through the design of the thin film transistor structure in the array substrate 10, a control of different display modes of the display panel 1 can be realized.

Please refer to FIG. 3 and FIG. 4, the display panel 1 includes a plurality of first electrodes 20. The first electrodes 20 are arranged in an array on the array substrate 10. A first interval 11 is formed between adjacent first electrodes 20 form in a first direction X. A second interval 222 is formed between adjacent first electrodes 20 in a second direction Y. Exemplarily, the first electrode 20 includes a short side 21 and a long side 22. The short side 21 is arranged along the first direction X. The long side 22 is arranged along the second direction Y. The first interval 211 is formed between the short sides 21 of the adjacent first electrodes 20. The second interval 222 is formed between the long sides 22 of the adjacent first electrodes 20.

The first electrode 20 is electrically connected to the thin film transistor in the array substrate 10, and disconnection and conduction of the first electrode 20 can be controlled by disconnection and conduction of the thin film transistor. The spaced arrangement of adjacent first electrodes 20 can avoid interference between adjacent first electrodes 20, so that each first electrode 20 can individually control a corresponding light-emitting pixel.

The display panel 1 includes a pixel definition structure. The pixel definition structure is disposed on the array substrate 10 and the first electrode 20. The pixel definition structure includes a first pixel definition layer 31 and a second pixel definition layer 32 arranged in a same layer. The materials of the first pixel definition layer 31 and the second pixel definition layer 32 have a function of converting between hydrophilicity and hydrophobicity. That is, the first pixel definition layer 31 and the second pixel definition layer 32 are respectively set with hydrophilicity or hydrophobicity to improve an overall performance of the display panel 1 according to the property requirements of the first pixel definition layer 31 and the second pixel definition layer 32 when manufacturing the first pixel definition layer 31 and the second pixel definition layer 32.

The materials of the first pixel definition layer 31 and the second pixel definition layer 32 have the function of converting between hydrophilicity and hydrophobicity and are arranged in a same layer, so that when the pixel definition structure is manufactured, the materials of the first pixel definition layer 31 and the second pixel definition layer 32 can be the same. After forming the target structures of the first pixel definition layer 31 and the second pixel definition layer 32, the conversion function of the material is used to adjust the hydrophilicity or the hydrophobicity of the first pixel definition layer 31 and the second pixel definition layer 32, so that the target structures of the first pixel definition layer 31 and the second pixel definition layer 32 can be formed simultaneously with one mask. That is, the first pixel definition layer 31 and the second pixel definition layer 32 are integrally formed to simplify the manufacturing process of the pixel definition structure and reduce the manufacturing cost.

Further, the first pixel definition layer 31 is positioned in the first interval 211 to separate the adjacent first electrodes 20 to avoid the conduction between the adjacent first electrodes 20 and mutual interference which affects a control of a display model of the display panel 1. The second pixel definition layer 32 is positioned in the second interval 222, and a printing groove 321 is formed between adjacent second pixel definition layer 32 to define the position of the light-emitting pixel.

It should be noted that the contact angles of the surfaces of the first pixel definition layer 31 and the second pixel definition layer 32 are different, that is, the hydrophilicity and hydrophobicity between the first pixel definition layer 31 and the second pixel definition layer 32 are different, such as the first pixel definition layer 31 has hydrophilicity, and the second pixel definition layer 32 has hydrophobicity. Since the second pixel definition layer 32 is mainly used to define the position of the light-emitting pixel, the first pixel definition layer 31 is mainly used to separate the adjacent first electrodes 20, that is, the main functions of the two are different, so that the requirements for the hydrophilicity and the hydrophobicity of the first pixel definition layer 31 and the second pixel definition layer 32 are also different. By setting the contact angles of the surfaces of the first pixel definition layer 31 and the second pixel definition layer 32 to be different, to help to improve the structural stability of the subsequent film layers, thereby improving an overall performance of the display panel 1.

The display panel 1 includes light-emitting layers 50 disposed on the first electrodes 20. The light-emitting materials of different colors are respectively dissolved in a solvent to form different inks when making the light-emitting layer 50, and then the inks are printed in the printing grooves 321 formed by the adjacent second pixel definition layers 32 by a process such as inkjet printing. In different printing grooves 321, inks formed from light-emitting materials of different colors are printed, and the inks are cured to form a film to form the light-emitting layer 50.

Please refer to FIG. 6 and FIG. 7, the red light-emitting material 51, the green light-emitting material 52, and the blue light-emitting material 53 are arranged in different printing grooves 321 at intervals. Since the printing groove 321 is continuous, ink can be continuously printed in the printing groove 321, and a concentration of the ink can be configured according to the thickness of the light-emitting layer 50 to be manufactured.

FIG. 6 schematically shows three printing grooves 321, but the display panel may include more first electrodes 20, so that more strips of the second pixel definition layers 32 are provided to form more printing grooves 321. The red light-emitting material 51, the green light-emitting material 52, and the blue light-emitting material 53 are sequentially arranged in more printing grooves 321 in a cycle.

At the same time, the light-emitting materials of a same color between the adjacent second pixel definition layers 32 are separated by the first pixel definition layer 31, so that the light-emitting materials only cover the first electrodes 20 in the light-emitting region, but not covered on the first pixel definition layer 31. However, different color light-emitting materials are printed in different printing grooves 321, so the adjacent first pixel definition layers 31 exhibit different color light-emitting materials arranged at intervals. That is, the first pixel definition layers 31 are configured to define light-emitting materials of a same color, and the second pixel definition layers 32 are configured to define light-emitting materials of different colors.

In some embodiments, the light-emitting layer 50 covers the first electrode 20 and the first pixel definition layer 31 at the same time, that is, when the light-emitting layer 50 is manufactured by inkjet printing, the printing ink in the printing groove 321 can flow between the adjacent first electrodes 20, to form a pixel row in the printing groove 321, thereby improving a structural uniformity of the light-emitting layer 50 in the printing groove 321 and improving the display effect of the display panel 1.

In the embodiment of the present application, the first pixel definition layer 31 and the second pixel definition layer 32 with different contact angles are provided, and the first pixel definition layer 31 and the second pixel definition layer 32 can be switched between hydrophilicity and hydrophobicity, so that the hydrophilicity and hydrophobicity of the first pixel definition layer 31 and the second pixel definition layer 32 can be adjusted according to the properties of the light-emitting layer 50 to improve the structural uniformity of the light-emitting layer 50, thereby improving the display effect of the display panel 1. At the same time, the first pixel definition layers 31 and the second pixel definition layers 32 are arranged in a same layer, so that the first pixel definition layers 31 and the second pixel definition layers 32 can be formed by a same mask, thereby helping to simplify the manufacturing process of the pixel definition structure, and reducing a manufacturing cost of the display panel 1.

Optionally, a height of a side of the second pixel definition layer 32 facing away from the array substrate 10 relative to the array substrate 10 is greater than a height of a side of the first pixel definition layer 31 facing away from the array substrate 10 relative to the array substrate 10. That is, a thickness of the second pixel definition layer 32 is greater than a thickness of the first pixel definition layer 31 when the pixel definition structure is manufactured to form the first pixel definition layer 31 and the second pixel definition layer 32.

This structural design makes the first pixel definition layer 31 not affect a circulation of the printing ink during a manufacturing of the light-emitting layer 50, and ensures the flow of the printing ink between the adjacent first electrodes 20, so that the structure of the light-emitting layer 50 is uniform. At the same time, the second pixel definition layer 32 can effectively limit the printing ink in the printing groove 321 to prevent the printing ink from flowing out of the printing groove 321 and crosstalk with other pixels in the adjacent printing groove 321, which affects the display effect of the display panel 1.

Optionally, the thickness of the second pixel definition layer 32 is greater than or equal to 1 micrometer and less than or equal to 2 micrometers. If the thickness of the second pixel definition layer 32 is too small, the height difference between the second pixel definition layer 32 and the first electrode 20 will be too small, which is not conducive to the manufacturing of the light-emitting layer 50 covering the first electrode 20. Even in the process of making the light-emitting layer 50, the printing ink overflows from the printing groove 321 on the second pixel definition layer 32 to cause crosstalk, thereby affecting the display effect of the display panel 1. If the thickness of the second pixel definition layer 32 is too large, as a result, the overall thickness of the display panel 1 is too large, which is not conducive to the thin and light design of the display panel 1, and affects an installation and use of the display panel 1.

In an actual manufacturing process, the thickness of the second pixel definition layer 32 can be disposed to 1 micron, 1.2 microns, 1.5 microns or 2 microns, etc., which can ensure an effective definition of the formation position of the light-emitting layers 50 by the second pixel definition layer 32, and also avoid that an overall thickness of the display panel 1 is too large to affect a normal use of the display panel 1. A specific value of the thickness of the second pixel definition layer 32 can be adjusted according to an actual situation, and no special limitation is made here.

Optionally, the thickness of the first pixel definition layer 31 is greater than or equal to 0.2 micrometers and less than or equal to 0.5 micrometers. If the thickness of the first pixel definition layer 31 is too small, an insulation effect of the first pixel definition layer 31 on the adjacent first electrodes 20 will be poor or even unable to effectively isolate the adjacent first electrodes 20, thereby affecting the control of the display mode of the display panel 1. if the thickness of the first pixel definition layer 31 is too large, a height difference between the first pixel definition layer 31 and the first electrode 20 will be too large, so that in the process of manufacturing the light-emitting layer 50, the printing ink cannot effectively circulate between the adjacent first electrodes 20, thereby affecting a structural uniformity of the light-emitting layer 50.

In the actual production process, the thickness of the first pixel definition layer 31 can be set to 0.2 microns, 0.3 microns, 0.4 microns, or 0.5 microns, etc., which can ensure that the first pixel definition layer 31 effectively isolates the adjacent first electrodes 20, and also ensure that the printing ink can effectively flow between the adjacent first electrodes 20, so as to ensure a structural uniformity of the light-emitting layer 50. A specific value of the thickness of the first pixel definition layer 31 can be adjusted according to the actual situation, and no special limitation is made here.

Optionally, in the embodiment of the present application, the thickness difference between the first pixel definition layer 31 and the second pixel definition layer 32 is greater than or equal to 0.5 micrometers and less than or equal to 1.8 micrometers. If a thickness difference between the first pixel definition layer 31 and the second pixel definition layer 32 is too large, it will cause the thickness of the second pixel definition layer 32 is too large when the isolation effect of the first pixel definition layer 31 on the first electrode 20 is ensured, thereby causing an overall thickness of the display panel 1 to be too large, which affects an installation and use of the display panel 1. If a thickness difference between the first pixel definition layer 31 and the second pixel definition layer 32 is too small, in the process of manufacturing the light-emitting layers 50, in order to ensure that the printing ink does not overflow from the printing groove 321 of the second pixel definition layer 32, the printing ink cannot flow effectively between the adjacent first electrodes 20, thereby affecting the structural uniformity of light-emitting layer 50.

In the actual manufacturing process, the thickness difference between the first pixel definition layer 31 and the second pixel definition layer 32 can be set to 0.5 microns, 0.8 microns, 1 microns, 1.5 microns or 1.8 microns, which can ensure the effective definition of formation position of the light-emitting layer 50 by the second pixel definition layer 32, and ensure the structural uniformity of the light-emitting layer 50, and also prevent the overall thickness of the display panel 1 from being too large to affect the normal use of the display panel 1. The specific value of the thickness difference between the first pixel definition layer 31 and the second pixel definition layer 32 can be adjusted according to the actual situation, and there is no special limitation here.

Optionally, a height of a side of the first pixel definition layer 31 facing away from the array substrate 10 relative to the array substrate 10 is greater than a height of a side of the first electrode 20 facing away from the array substrate 10 relative to the array substrate 10. That is, the thickness of the first pixel definition layer 31 is greater than the thickness of the first electrode 20. This structural design enables the first pixel definition layer 31 to effectively isolate the adjacent first electrodes 20 to avoid interference between adjacent first electrodes 20, thereby ensuring that each first electrode 20 effectively regulates the light-emitting mode of the corresponding light-emitting layer 50 region, so as to ensure the display effect of the display panel 1.

The first pixel definition layer 31 is partially overlapped on a side of the first electrode 20 away from the array substrate 10. That is, the first pixel definition layer 31 wraps an edge of the adjacent first electrode 20. During the manufacturing of the first electrode 20, due to the influence of the manufacturing process and manufacturing accuracy, defects such as burrs may appear on the edge of the first electrode 20. By overlapping the first pixel definition layer 31 on the side of the first electrode 20 away from the array substrate 10, the possible burrs on the edge of the first electrode 20 can be wrapped, thereby reducing the risk of short circuit between the first electrode 20 and the cathode disposed on the light-emitting layer 50, and ensure the normal display of the display panel 1.

Optionally, in one embodiment of the present application, a height of the light-emitting layer 50 relative to the array substrate 10 is greater than a height of the first pixel definition layer 31 relative to the array substrate 10 and smaller than a height of the second pixel definition layer 32 relative to the array substrate 10. That is, a thickness of the light-emitting layer 50 is greater than a thickness of the first pixel definition layer 31 and smaller than a thickness of the second pixel definition layer 32. This structural design can ensure the effective limitation of the placement position of the light-emitting layers 50 by the second pixel definition layer 32, avoid the printing ink for making the light-emitting layers 50 from overflowing from the printing groove 321 of the second pixel-defining layer 32. This structural design can also ensure the effective circulation of the printing ink in the printing groove 321 during the manufacturing of the light-emitting layers 50, thereby ensuring the structural uniformity of the light-emitting layers 50.

Optionally, the display panel 1 further includes an electron transport layer 70, a second electrode 60, and an encapsulation layer 80 which are arranged in sequence. The electron transport layer 70 is disposed on the light-emitting layer 50 to increase electron mobility and improve the light-emitting effect of the light-emitting layer 50. The second electrode 60 is disposed on the electron transport layer 70, and the display mode of the display panel 1 is regulated by controlling the conduction and disconnection between the second electrode 60 and the first electrode 20. The encapsulation layer 80 is disposed on the second electrode 60 to encapsulate the internal structure of the display panel 1 to prevent moisture or oxygen in the air from eroding the display panel 1 and affecting the display effect of the display panel 1.

One embodiment of the present application further provides a display device, which includes a display panel. The specific structure of the display panel refers to the above-mentioned embodiments. Since the display device adopts all the technical solutions of all the above-mentioned embodiments, it has at least the above-mentioned embodiments. All the beneficial effects brought by the technical solution, which would not repeat here.

Figure 14:
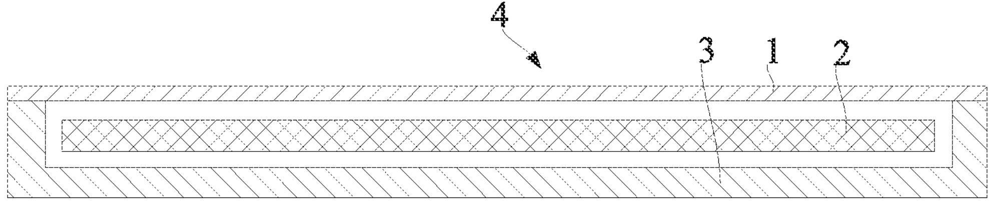
FIG. 14 is a schematic structural diagram of the display device provided by one embodiment of the present application.

FIG. 14 is a schematic structural diagram of a display device according to one embodiment of the present application. As shown in FIG. 14, the display device 4 includes a display panel 1, a control circuit 2, and a casing 3. The casing 3 is connected to the display panel 1 to support and fix the display panel 1. The control circuit 2 is arranged in the casing 3 and is electrically connected to the display panel 1 to control the display panel 1 to display images.

The display panel 1 can be fixed on the casing 3 to form a whole with the casing 3. The display panel 1 and the casing 3 form a closed space for accommodating the control circuit 2. The control circuit 2 can be a main board of the display device 4, and at the same time, the control circuit 2 can also be integrated with one or more functional components such as a battery, an antenna structure, a microphone, a speaker, a headphone interface, a universal serial bus interface, a camera, a distance sensor, an ambient light sensor, a receiver, and a processor, to make the display device 4 can be adapted to various application fields.

It should be noted that the display device 4 is not limited to the above contents, and may also include other devices, such as a camera, an antenna structure, a fingerprint unlocking module, etc., to expand its application fields, which is not limited here. The display device 4 in the embodiment of the present application has a wide range of applications, including televisions, computers, and flexible displays such as foldable or rollable display screens and lighting, etc., which are all within a scope of application fields of the display device 4 in the embodiment of the present application.

A method of manufacturing a display panel, a display panel, and a display device provided by the embodiments of the present application are described above in detail. The principles and implementations of the present application are described with specific examples in this paper. The descriptions of the above embodiments are only used to help understand the technical solutions and core ideas of the present application. Those of ordinary skill in the art should understand that: It is still possible to modify the technical solutions recorded in the foregoing embodiments, or perform equivalent replacements to some of the technical features. However, these modifications or substitutions do not make the essence of the corresponding technical solutions deviate from a scope of the technical solutions of the embodiments of the present application.

What is claimed is:

1. A method of manufacturing a display panel, comprising the following steps:

- providing an array substrate;
- manufacturing a plurality of first electrodes on the array substrate, wherein the plurality of first electrodes are arranged in an array on the array substrate, wherein a first interval is formed between adjacent first electrodes in a first direction, and wherein a second interval is formed between adjacent first electrodes in a second direction;
- covering a whole layer of a negative material on the first electrodes and the array substrate;
- exposing and developing the whole layer of the negative material, wherein the negative material in the first interval forms a first pixel definition layer with hydrophobicity, and wherein the negative material in the second interval forms second pixel definition layer with hydrophobicity;

exposing the first pixel definition layer again to make the first pixel definition layer hydrophilic; and manufacturing a plurality of light-emitting layers on the first electrodes, wherein each of the light-emitting layers covers the first pixel definition layer between adjacent second pixel definition layers, and the light-emitting layer is entirely hydrophilic, wherein a whole surface of the first pixel definition layer in contact with the light-emitting layers is entirely hydrophilic;

wherein a thickness of the second pixel definition layer is greater than a thickness of the first pixel definition layer in a direction perpendicular to the array substrate.

2. The method of manufacturing the display panel according to claim 1, wherein the thickness of the first pixel definition layer ranges from 0.2 um to 0.5 um, and wherein the thickness of the second pixel definition layer ranges from 1 um to 2 um.

3. The method of manufacturing the display panel according to claim 1, wherein the thickness of the first pixel definition layer is greater than a thickness of the first electrode.

4. The method of manufacturing the display panel according to claim 1, wherein a thickness of the light-emitting layer is less than the thickness of the second pixel definition layer.

5. The method of manufacturing the display panel according to claim 1, wherein in the step of exposing the first pixel definition layer again, UV light is used to expose the first pixel definition layer again.

6. The method of manufacturing the display panel according to claim 1, wherein the step of exposing the first pixel definition layer again to make the first pixel definition layer hydrophilic comprises the following steps:

providing a reticle;

placing the reticle on the negative material such that an opening on the reticle corresponds to the first pixel definition layer;

exposing the first pixel definition layer again to change a material of the first pixel definition layer from hydrophobic to hydrophilic; and removing the reticle.

7. The method of manufacturing the display panel according to claim 6, wherein the step of providing the reticle comprises the following steps:

providing a transparent substrate;

forming a metal layer on the transparent substrate, and etching the metal layer to form an opening on the metal layer;

forming a plurality of support columns on a side of the transparent substrate away from the metal layer to form the reticle.

8. The method of manufacturing the display panel according to claim 7, wherein a thickness of the support column is greater than or equal to 0.2 micrometers and less than or equal to 0.8 micrometers.

9. The method of manufacturing the display panel according to claim 1, wherein the thickness of the first pixel definition layer is less than a thickness of the light-emitting layer.

10. The method of manufacturing the display panel according to claim 1, wherein in the step of exposing and developing the whole layer of the negative material, a halftone reticle is configured to expose and develop the whole layer of the negative material.

11. The method of manufacturing the display panel according to claim 1, wherein a printing groove is formed between adjacent second pixel definition layers, and wherein a light-emitting material is continuously printed along an extending direction of the printing groove to form a light-emitting layer.

12. The method of manufacturing the display panel according to claim 1, further comprising: after the step of manufacturing the plurality of light-emitting layers, manufacturing a plurality of second electrodes on the light-emitting layers and the second pixel definition layer.

* * * * *